United States Patent [19]

Kahn

[11] Patent Number: 5,116,110
[45] Date of Patent: May 26, 1992

[54] PARTIALLY COHERENT OPTICAL SYSTEM WITH SCATTERING TYPE OBJECT

[75] Inventor: Frederic J. Kahn, Palo Alto, Calif.

[73] Assignee: Greyhawk Systems, Inc., Milpitas, Calif.

[21] Appl. No.: 318,671

[22] Filed: Mar. 3, 1989

[51] Int. Cl.$^5$ .................................................. G02F 1/13
[52] U.S. Cl. ........................................ 359/40; 353/122; 359/45; 359/49
[58] Field of Search ................ 350/331 T, 334, 350 S, 350/331 R, 345, 351; 353/122, 29, 30, 120

[56] References Cited

U.S. PATENT DOCUMENTS

| | | | |
|---|---|---|---|
| 3,850,515 | 11/1974 | Burch | 353/122 X |
| 4,067,638 | 1/1978 | Yano et al. | 350/3.76 X |
| 4,613,207 | 9/1986 | Fergason | 350/331 R |
| 4,623,219 | 11/1986 | Trias | 350/351 |
| 4,728,174 | 3/1988 | Grinberg et al. | 350/334 |
| 4,728,185 | 3/1988 | Thomas | 353/122 |
| 4,756,604 | 7/1988 | Nakatsuka et al. | 350/331 R |
| 4,763,993 | 8/1988 | Vogeley et al. | 350/331 T |
| 4,772,098 | 9/1988 | Ogawa | 350/331 T |
| 4,824,210 | 4/1989 | Shimazaki | 350/331 R |
| 4,832,446 | 5/1989 | Miyagawa | 350/162.12 |

*Primary Examiner*—Stanley D. Miller
*Assistant Examiner*—Huy K. Mai
*Attorney, Agent, or Firm*—Flehr, Hohbach, Test, Albritton & Herbert

[57] ABSTRACT

An optical system having a projection lens for imaging a scattering type thermo optic cell on an image receiving surface, comprising optical source apparatus for generating an optical beam and an image created on the scattering type thermo optic cell having a minimum feature size, the optical beam propagating through the object on the scattering type thermo optic cell. Also provided is a condenser system which illuminates the scattering cell and underfills the aperture of the projection lens, thereby creating a partially coherent imaging system. As a result, a relatively higher contrast ratio for the minimum features of the image is obtained at the image receiving surface.

14 Claims, 1 Drawing Sheet

PARTIALLY COHERENT OPTICAL SYSTEM WITH SCATTERING TYPE OBJECT

BACKGROUND OF THE INVENTION

The present invention relates to an optical system incorporating a projection lens that images a scattering type liquid crystal object on an image receiving surface. More specifically, the present invention relates to a method and apparatus for partially coherent illumination of the projection lens and the scattering type object in order to produce minimum size image features with higher peak to valley contrast ratios than would be achieved with incoherent illumination.

SUMMARY OF THE PRIOR ART

Projection imaging is widely known in the art and used for applications as diverse as projection of slides and viewgraphs in presentation graphics and for movie projectors in theaters and homes. A major commercial application of projection imaging is projection optical lithography which is used to pattern the increasingly fine features required for modern integrated circuits. These applications all generally use nonscattering-type slides or objects in which there is a spatial variation of opacity as, for example, in the common 35 mm color slide. The object is illuminated with an appropriate light source and light condensing system and imaged, using a projection lens, on a receiving surface. In the case of slide or movie projection, the receiving surface is generally a projection screen. In the case of optical lithography the receiving surface is typically a thin layer of photosensitive material, commonly a positive or negative working photoresist, which is developed subsequent to exposure to form a mask which can be used for patterning the various layers required for integrated circuits or other components of technical or commercial interest.

It is generally easier, or less expensive, to design and build an optical system for imaging a nonscattering type object than for imaging a scattering object. This is because the optical system for use with the scattering object, which has a spatial variation of light scattering ability, must discriminate between scattered and non-scattered light, typically by use of one or more apertures or stops and by use of an appropriate illumination system that optimally and uniformly illuminates the scattering object and projection aperture. The illumination and projection systems for scattering type objects typically are custom designed to take best advantage of the specific scattering abilities of specific types of scattering objects. This is because the scattering abilities of different types of scattering objects can vary widely.

In spite of the above difficulties, it is often advantageous to use scattering type objects and, as illustrated by pending U.S. applications Ser. No. 861,492, entitled Apparatus and Method of Forming and Projecting High Precision Optical Images, filed May 9, 1986, now U.S. Pat. No. 4,818,098, and Ser. No. 262,471, entitled Fabrication of Printed Wiring Boards by Projection Imaging, filed Oct. 26, 1988 now abandoned, projection imaging systems incorporating scattering type objects, for example laser-written smectic liquid crystals, are well known in the art. Advantages of the scattering type objects include very low absorption of incident light, very high resolution, nonvolatile storage of information, and the ability to be written or edited by electronic means such as by computer controlled scanning of a focused laser beam. These advantages are cited or used in the referenced pending application.

A significant limitation of prior art projection systems incorporating scattering type targets is the relatively low contrast and resolution of the projected images, as compared for example to projected images of well exposed, nonscattering, photographic film or of nonscattering masks, for example, silver halide or chrome-on-glass, commonly used in optical lithography. This difference in relative contrast is fundamental and arises because of the tradeoff between projection lens numerical aperture (NA) and large area contrast ratio (contrast ratio of large features) in a typical scattering object projection system. For example, in a bright-field type of projection system, high large area contrast ratio will require relatively high projection NAs, that is, relatively small acceptance angles, so that minimum scattered light will be collected by the projection lens and thereby imaged on the dark areas. Bright image features will correspond to low or nonscattering object areas and, conversely, dark image features will correspond to high-scattering object areas. Due to optical diffraction, the requirement of relatively high NA projection optics for use with scattering objects limits the MTF (modulation transfer function) and contrast ratio for the finest (small area) features. Lower NA projection lenses can be used for nonscattering objects without washing out the large area contrast. These lower NAs allow fine features of nonscattering objects to be projected with correspondingly higher MTF and contrast ratio.

Nevertheless because projection lenses cannot be fabricated with arbitrarily low NAs, optical diffraction eventually limits the fine feature MTF and contrast ratio even for images of nonscattering objects. This has been of particular importance in optical lithography where projected images with increasingly finer features have been required in recent years. In optical lithography, for integrated circuits in particular, the goal is to create areal images with sufficient image quality of the finest features to enable the finest features to be reproduced in the photoresist with acceptable quality for use in subsequent circuit patterning operations. The critical, acceptability determining parameters of the areal image are the MTF and contrast ratio for these finest features. Scattering-type objects have not been used for projection optical lithography because of the relatively poor contrast of fine features.

The use of partial coherence to boost the resolution, i.e., fine feature contrast ratio and MTF, of lithographic exposure systems is well known for projection systems using nonscattering types of objects, see Dr. Michael C. King, Principles of Optical Lithography in VLSI Electronics: Microstructure Science, Vol. 1. This technology has not, however, been applied to projection systems incorporating scattering type objects. The mathematical basis for analysis of coherent imaging systems describes the diffraction of light by the object being projected and the collection and recombination of the various diffracted orders by the projection lens. Computation of the diffraction of light by a scattering object is exceedingly difficult or impossible to handle mathematically in closed form. Thus, there has been no mathematical basis for proving or disproving the applicability of coherent or partially coherent imaging to systems incorporating scattering objects. As pointed out by Dr. King on p. 60, coherent systems are linear in amplitude and thus dependent on the relative phase of each (spatial) frequency component. Coherent systems are thus degraded by small imperfections in the optical system that vary the phase. Because scattering objects change the phase relationships of light rays emanating from adjacent regions of the object and also change the phase relationships of light rays emanating from the same region or point, but in different directions, it has been generally thought that scattering objects would destroy the phase coherence required for successful coherent or partially coherent imaging.

In contrast, incoherent systems are linear in intensity and, therefore, less sensitive to phase variation. The conventional design of an optical projection system incorporating a scattering-type object involves the selection or design of a projection lens with an NA which optimizes the tradeoff between large areas and fine feature contrast ratio and the design of an illumination system which totally fills the full aperture area and acceptance angle, NA, of that lens. This illumination system design provides maximum image intensity at the receiving surface for a given projection light source. It also corresponds to a so-called $S=1$ or incoherent illumination condition, see, for example, Dr. King p. 61. Thus conventional image projection systems using scattering-type objects have been of the incoherent type and have been relatively insensitive to the phase variations of the scattering-type object.

In the case of scattering objects comprised of laser-written, thermooptic, smectic liquid crystal cells or light valves, the scattering object consists of a three dimensional texture of optically uniaxial regions in which the direction of uniaxial order varies spatially continuously and discontinuously in a statistical and random manner through the liquid crystal. There are primarily short range spatial correlations in orientation. The resulting textures are often referred to as focal conic or spherulitic. These spatial variations shift both the phase and direction of light propagating through the liquid crystal and therefore prior to the present invention, it has been thought that they would destroy the phase relationships required for coherent or partially coherent imaging.

Although incoherent imaging is less sensitive to phase variations, it is generally incapable of obtaining the high contrast ratio of fine features required for lithographic applications. For example, for the visible light sensitive, dry negative resists, such as Riston which is a commercial product of DuPont and is commonly used for fabrication of printed circuit boards, we have found that pine feature contrast ratios between 20:1 and 32:1 are required in the areal image for acceptable printing and etching of fine features. In a typical projection system designed for off-axis, incoherent imaging of a reflective mode, scattering-type smectic liquid crystal object, fine feature contrast ratios less than 10:1 were achievable for areal images of 0.006" minimum features over a 12"×18" field. Thus fabrication of printed circuit boards using scattering-type, smectic liquid crystal objects was judged to be impractical unless we would reduce our system requirements, such as by accepting larger minimum feature sizes or smaller image fields.

In view of the shortcomings of the prior art, it is necessary to provide improved imaging systems for use with scattering-type objects which are capable of projecting areal images with higher contrast ratio fine features over acceptably large image fields.

SUMMARY OF THE INVENTION

Accordingly, it is the object of the present invention to provide an improved imaging system and method for use with scattering-type objects, such as thermo optic smectic liquid crystal cells, which is capable of projecting areal images with higher contrast ratio, minimum sized features over large image fields.

It is an object of the present invention to provide an image projection system based on partially coherent imaging of scattering-type objects on an image receiving surface.

It is also an object of the present invention to provide an image projection system with a laser-written thermooptic smectic liquid crystal cell as a scattering-type projection object, said system providing images of sufficient quality for use in exposing photosensitive resists for printed circuit board or integrated circuit manufacture.

The attainment of these and related objects may be achieved through use of the novel partially coherent optical projection system herein disclosed. A partially coherent optical projection system in accordance with this invention has an optical system having a projection lens for imaging a scattering type object on an image receiving surface, including said projection lens, an optical source apparatus for generating an optical beam, and a scattering-type object having a minimum feature size, the optical beam propagating through the image on the scattering type object. The optical source apparatus includes a projection lamp and a condenser system designed to illuminate the full area of the scattering object and to partially fill the numerical aperture of the projection lens, thereby providing a system with partially coherent imaging properties, whereby a relatively higher contrast ratio for the minimum features is obtained at the image receiving surface.

The attainment of the foregoing and related objects, advantages and features of the invention should be more readily apparent to those skilled in the art, after review of the following more detailed description of the invention, taken together with the drawings, in which:

DETAILED DESCRIPTION OF THE PREFERRED EMBODIMENT

Figure 1:
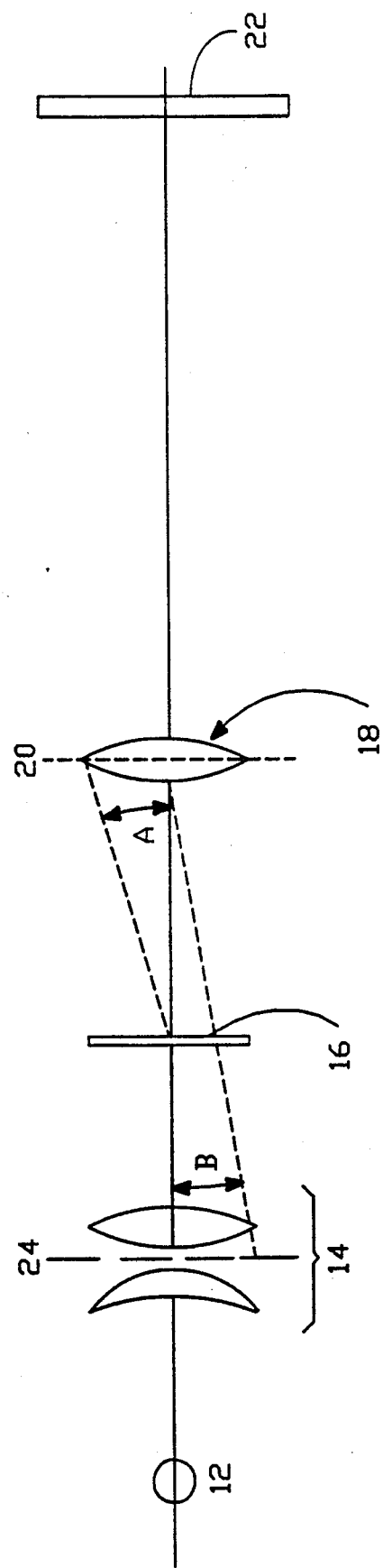
FIG. 1 is a diagrammatic illustration of the preferred embodiment.

Referring to FIG. 1, a diagrammatic view of the component part of the partial coherence projection system of the preferred embodiment is shown. A optical source 12 provides an optical beam to be input to the condenser lens 14. A typical light source 12 is a 5 KW Xenon Arc Lamp, manufactured by Optical Radiation Corp. Light output of this source is broadband, uncollimated, unpolarized and incoherent. This light is collected by condenser lens 14 and the source itself or, for example, by the output of an optical integrator illuminated by such a lamp. The light is imaged on the aperture plane 20 of projection lens 18. The scattering object 16 which is interposed between the condenser 14 and projection lens 18 is illuminated by the light. Projection lens 18 images object 16 on image receiving surface 22.

The numerical aperture of the projection lens is sin A and of the condenser illumination system is Sin B where B is determined by aperture 24. A filling parameter S is defined by the ratio of illuminator NA to projection optics NA, i.e., S=[sin B]/[sin A]. When S=0 (or close to 0) the system is (essentially) coherent, this corresponds to severe underfilling and illumination with collimated light. When S=infinity the pupil is overfilled and the system is incoherent. In practice S=infinity and S=1 give little difference in the projected image. When S is less than one the numerical aperture of the projection lens is only partially filled and the system will have partially coherent imaging.

In the preferred embodiment, the scattering object is a thermo optic cell capable of "holding" or storing an image. The term thermo optic refers to the cells ability to have differing optical properties depending on its thermal history. A common thermo optic cell for image creation is a liquid crystal cell. The creation of thermooptic images in liquid crystal cells by scanned lasers is further discussed in pending U.S. application Ser. No 262,471, filed Oct. 26, 1988 and in the copending application "Pulsed Optical Darkening."

In the preferred embodiment, the projection lens aperture 20 is only partially filled by the illumination condenser 18 so as to produce partially coherent light imaging. A primary emphasis of the projection system of the preferred embodiment is to create an image on the image receiving surface 22 with feature sizes equal to or greater than a specified minimum feature size and contrast ratios also greater than a specified minimum. The result of using a partially coherent illumination 26 is that a higher contrast ratio for object minimum features is obtained at the image receiving surface 22 than would be with incoherent light, i.e., filled or overfilled aperture illumination.

In the preferred embodiment which uses a 5 KW Xenon arc lamp and a 436 projection wavelength a transmissive-mode laser written thermooptic smectic A liquid crystal scattering object with 4"×4" active area and minimum feature widths of 12.5 microns, a partially coherent imaging condition with S=0.7, a receiving surface area or field of 24"×24", and an f/8 projection lens operated at 6× magnification, greater than 20:1 bright to dark contrast ratios for minimum feature sizes of 0.003" width in the areal projected image are achieved. We have found these contrast ratios to be acceptable for exposing dry Riston photoresists to be used for fabrication of printed circuit boards. Without partially coherent imaging, i.e., for fill factors S equal to or greater than 1, contrast ratios less than 10:1 would have been achieved for the same liquid crystal cells and minimum feature sizes.

Thus contrary to the conventional wisdom which said that coherent or partially coherent imaging would not be advantageous for use with scattering type objects because of the phase destroying properties of these scattering type objects, we have shown that partial coherence can improve contrast ratios by 2× or more and MTF by 10% or more when used with scattering type objects. We believe these improvements have particular significance in lithographic applications where differences in MTF or contrast ratios of these magnitudes will make the difference between resolving or not resolving minimum size features in conventional photoresist materials. These lithographic applications include integrated circuit manufacture, integrated optics manufacture, and other patterning applications such as fabrication of thin film transistor arrays for flat panel liquid crystal displays, as well as fabrication of printed circuit boards.

It is advantageous to use fill factors S between 0.5 and 0.9. The lower fill factors will give the greatest increase in contrast ratio of the minimum sized image features while the highest fill factors will allow higher projected image intensity with a given light source. Partially coherent illumination is beneficial for lithographic systems incorporating either reflective or transmissive scattering type objects.

Projection systems incorporating other types of scattering and diffracting type objects such as electrophoretic objects, oil films, and deformable polymers, such as Ruticons, could also benefit from application of partially coherent imaging as taught in this patent.

It should further be apparent to those skilled in the art that various changes in form and details of the invention as shown and described may be made. It is intended that such changes be included within the spirit and scope of the claims appended hereto.

What is claimed is:

1. An optical system having a projection lens for imaging a scattering type object on an image receiving surface, comprising:
   light generating means for propagating light towards and through a scattering type object having an image impressed therein;
   projection lens means for imaging said scattering type object onto an image receiving surface; and
   optical condenser means located between said light generating means and said scattering type object for condensing light before said light propagates through said scattering type object in such a manner that said condensed light underfills said projection lens means to produce a partially coherent illumination of said projection lens means;
   said partially coherent illumination being propagated onto said image receiving surface for creating said image on said image receiving surface.

2. The optical system of claim 1 wherein the scattering type object comprises a scattering type thermo optic cell.

3. The optical system of claim 2 wherein the thermo optical cell comprises a liquid crystal cell.

4. The optical system of claim 3 wherein the thermo optic cell further comprises a laser addressed liquid crystal cell.

5. The optical system of claim 4 wherein the liquid crystal is a smectic liquid crystal.

6. The optical system of claim 1 wherein the condensed light underfills the aperture means by a fill factor between 0.5 and 0.9.

7. The optical system of claim 6 including a photosensitive material disposed at said image receiving surface.

8. The optical system of claim 7 including an integrated circuit substrate having said photosensitive material laminated thereon disposed at said image receiving surface.

9. A partially coherent optical system for producing high resolution images, comprising:
   liquid crystal scattering type object having an image therein, said image containing a minimum feature size;
   optical source means for propagating light through said scattering type object;
   projection lens means located between said scattering type object and an image receiving means for projecting light propagating through said scattering type object on to said image receiving surface; and optical condenser means located between said optical source and said scattering type object for condensing light to propagate said scattering type object so that said condensed light underfills said projection lens means in such a manner as to produce a partially coherent illumination propagating from said projection lens means to said image receiving surface, said partially coherent illumination containing said image so that said image is transported to said image receiving surface.

10. The optical system of claim 9 wherein the condensed light underfills the projection lens by a fill factor between 0.5 and 0.9.

11. A method for system having a projection lens imaging a scattering type object on an image receiving surface in an optical system having a projection lens, comprising the steps of:

propagating an optical beam through a scattering type object having an image therein;

projecting said optical beam propagated through said scattering type object on to an image receiving surface;

condensing said optical beam before propagation through said scattering type object; and underfilling a projection means with said condensed light to produce a partially coherent illumination of said projection means for transporting said image to said image receiving surface.

12. The method of claim 11 wherein the condensed light underfills the aperture means by a fill factor between 0.5 and 0.9.

13. The method of claim 11 wherein the scattering type object comprises thermo optic cell including a laser written smectic liquid crystal cell.

14. The optical system of claim 7 including an printed circuit substrate having said photosensitive material laminated thereon disposed at said image receiving surface.

* * * * *